US011227640B2

(12) United States Patent
Shih et al.

(10) Patent No.: US 11,227,640 B2
(45) Date of Patent: Jan. 18, 2022

(54) MEMORY SENSE AMPLIFIER TRIMMING

(71) Applicant: Taiwan Semiconductor Manufacturing Company, Ltd., Hsinchu (TW)

(72) Inventors: Yi-Chun Shih, Taipei (TW); Chia-Fu Lee, Hsinchu (TW); Yu-Der Chih, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/870,220

(22) Filed: May 8, 2020

(65) Prior Publication Data

US 2021/0350836 A1    Nov. 11, 2021

(51) Int. Cl.
| G11C 7/08 | (2006.01) |
| G11C 7/06 | (2006.01) |
| G11C 11/16 | (2006.01) |
| G11C 29/42 | (2006.01) |
| G11C 7/10 | (2006.01) |

(52) U.S. Cl.
CPC .............. *G11C 7/08* (2013.01); *G11C 7/067* (2013.01); *G11C 7/1039* (2013.01); *G11C 11/1673* (2013.01); *G11C 29/42* (2013.01)

(58) Field of Classification Search
CPC ...................................................... G11C 7/08
USPC ................................................ 365/189.011
See application file for complete search history.

(56) References Cited

U.S. PATENT DOCUMENTS

| 2002/0054507 | A1 | 5/2002 | Makuta et al. |
| 2007/0033449 | A1 | 2/2007 | Hwang et al. |
| 2007/0140003 | A1* | 6/2007 | Ido .......................... G11C 8/08 365/185.2 |
| 2010/0118593 | A1* | 5/2010 | Cho ...................... H01L 29/868 365/148 |
| 2010/0223532 | A1 | 9/2010 | Kang et al. |
| 2013/0044535 | A1* | 2/2013 | Shimakawa ............. G11C 7/14 365/148 |
| 2015/0092469 | A1* | 4/2015 | Kim ........................ G11C 7/14 365/148 |
| 2015/0262640 | A1 | 9/2015 | Katayama |
| 2017/0186472 | A1* | 6/2017 | Jan ....................... G11C 29/021 |
| 2019/0164579 | A1 | 5/2019 | Glazewski et al. |

FOREIGN PATENT DOCUMENTS

| JP | 2015-49920 A | 3/2015 |
| KR | 10-2002-0036697 A | 5/2002 |
| KR | 10-2007-0013110 A | 1/2007 |

* cited by examiner

*Primary Examiner* — Muna A Techane
(74) *Attorney, Agent, or Firm* — Merchant & Gould P.C.

(57) ABSTRACT

A memory device, such as an MRAM memory, includes a memory array with a plurality of bit cells. The memory array is configured to store trimming information and store user data. A sense amplifier is configured to read the trimming information from the memory array, and a trimming register is configured to receive the trimming information from the sense amplifier. The sense amplifier is configured to receive the trimming information from the trimming register so as to operate in a trimmed mode for reading the user data from the memory array.

20 Claims, 7 Drawing Sheets

MEMORY SENSE AMPLIFIER TRIMMING

BACKGROUND

The improvement in integration density of electronic components (e.g., transistors, diodes, resistors, capacitors, etc.) in integrated circuits (IC) has come from shrinking the semiconductor process node, which entails reductions in operating voltage and current consumption of electronic circuits developed in the semiconductor process node. Accordingly, access speed of memory integrated circuits is expected to become faster. For example, some memories have a very small read window, which requires a low-offset sense amplifier for a successful read operation.

A nonvolatile memory device is capable of retaining data even after power is cut off. Examples of nonvolatile memory devices include flash memory, ferroelectric random access memories (FRAMs), phase-change random access memories (PRAMs), and magnetic random access memories (MRAMs) among others. MRAMs store data using variations in the magnetization direction at tunnel junctions. The two states of an MRAM cell can be sensed from their relatively higher or lower resistances (RH and RL), which represent different binary logic values of a bit stored in the memory. For example, RL (or high cell current) may be designated as a logical "0" ("Data-0"); RH (or low cell current) may be designated as a logical "1" ("Data-1"). A bit of data, a logic "0" or "1" value, stored in a MRAM bit cell can be determined by a sense amplifier that compares a current that flows through the bit cell to a reference current. Due to process variations, individual MRAM cells in an array may have different RH values (when programmed at RH) and different RL values (when programmed at RL). Such process variations may also lead to a mismatch or offset in a sense amplifier circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
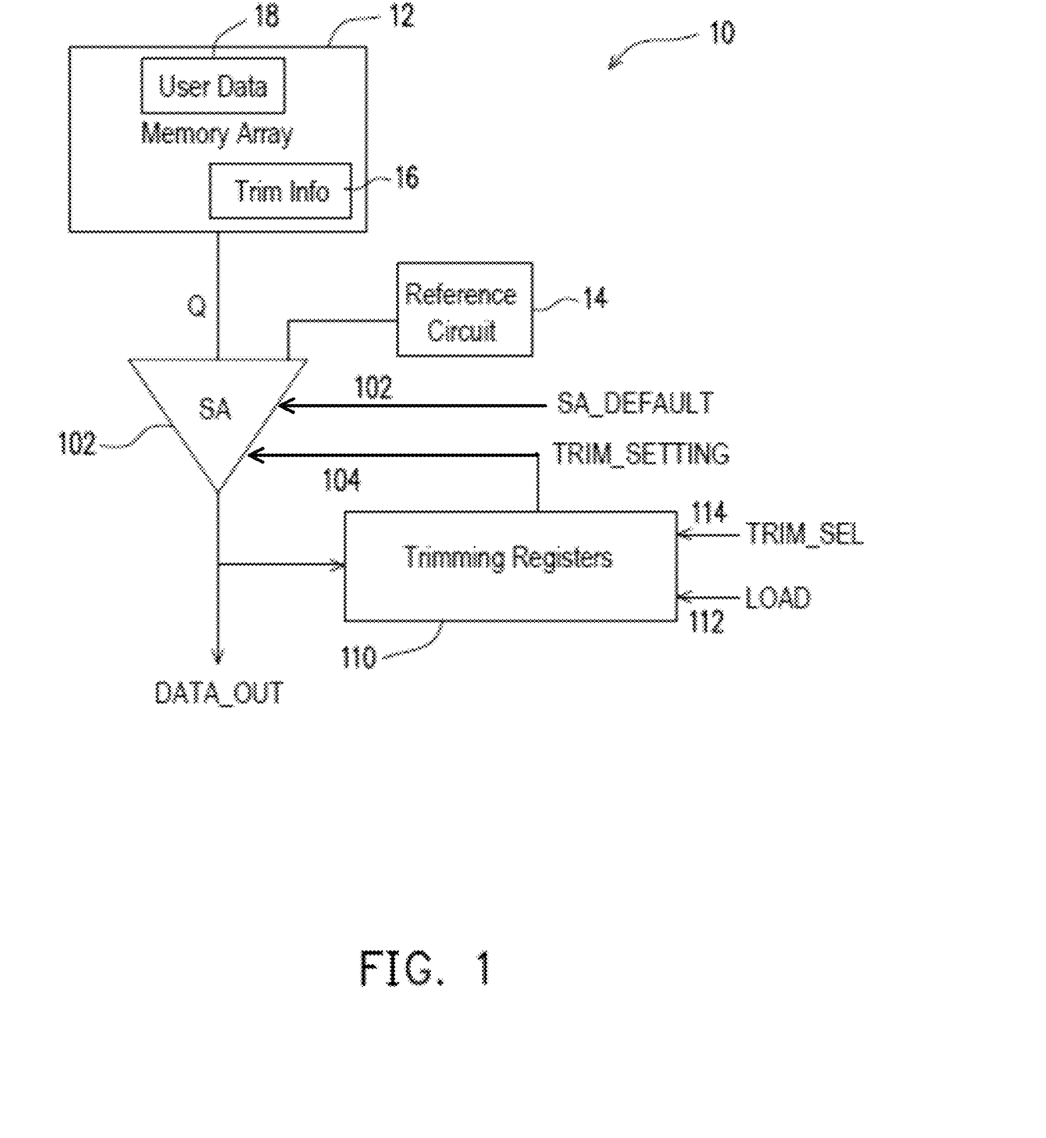
FIG. 1 is a block diagram illustrating an example of a memory device in accordance with some embodiments.

FIG. 1 illustrates an example memory device 10 in accordance with disclosed embodiments. The device 10 includes a memory array 12 that includes an array of bit cells. In some examples, the array may include magnetic random access memory (MRAM) bits cells, though other memory types such as resistive random access memory (RRAM, ReRAM) bits, or the like are within the scope of the present disclosure. MRAM stores data at bit cells having two superimposed layers of magnetic material separated by a thin insulating film. The layered structure forms a magnetic tunnel junction ("MTJ" or "MTJ element") of an MRAM cell. The two layers include a magnetic layer that is permanently magnetized in a fixed magnetic field alignment direction (this layer is referred to as a "pinned layer") and a changeably-magnetized magnetic layer (this layer is referred to as a "free layer"). The free layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel) or opposite to that of the permanent magnet layer (anti-parallel). The parallel alignment state has a relatively lower resistance (RL) and the anti-parallel alignment state has a higher resistance (RH).

The bit cells are configured to store a bit logic "0" or "1" value of data Q therein. In an exemplary read operation, read voltages are applied to the memory device 10, whereby a read current flows between the memory array 12 and a sense amplifier 100. Additionally, a reference current Iref flows between a reference circuit 14 having reference MRAM cells and the sense amplifier 100. The sense amplifier 100 compares the read current Iread to the reference current Iref to sense a bit logic "0" or "1" value of data Q stored in a bit cell of the memory array 12. When it is determined that the read current Iread is less than the reference current Iref, the sense amplifier 100 senses a logic "1" data value Q. Conversely, when it is determined that the read current Iread is greater than the reference current Iref, the sense amplifier 100 senses a logic "0" value Q. The sense amplifier 100 amplifies the level of that sensed bit of data Q and provides the amplified bit of data as an output DATA OUT, such that the bit of data Q can be read from the bit cell. In some embodiments, the sense amplifier 100 is a differential sense amplifier. In other embodiments, the sense amplifier 100 is a single ended sense amplifier.

Figure 2:
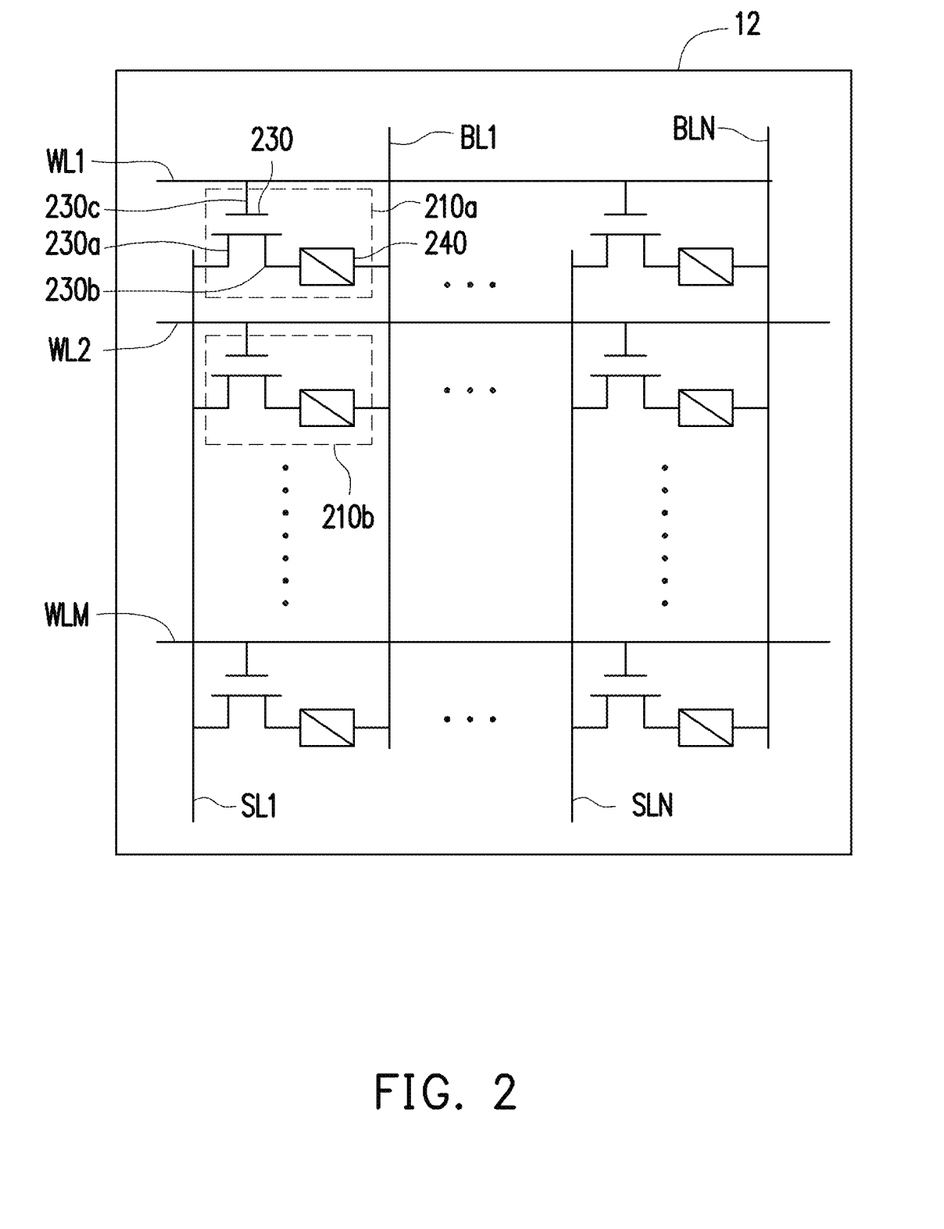
FIG. 2 is a circuit diagram illustrating an example of an MRAM memory array of the memory device shown in FIG. 1 in accordance with some embodiments.

FIG. 2 is a circuit diagram illustrating an example of the memory array 12 in accordance with some embodiments. In the example shown, the array 12 includes a plurality of the bit cells arranged in an array of rows and columns. For clarity of illustration, only two of the bit cells are labeled in FIG. 2, i.e., one of the bit cells in the first row labeled as 210a and one of the bit cells in the second row labeled as 210b. The bit cells may collectively be referred to as bit cells 210.

As illustrated in FIG. 2, the memory array 12 further includes a plurality of word lines (WL1, WL2, WLM, etc.), bit lines (BL1, BLN, etc.), and source lines (SL1, SLN, etc.). The word line WL1 connects the bit cells 210 in the first row, the word line WL2 connects the bit cells 210 in the second row, and the word line WLN connects the bit cells 210 in the Nth row. The bit line BL1 and the source line SL1 connect the bit cells 210a, 210b, etc., in the first column, and the bit line BLN and the source line SLN connect the bit cells 210 in the second column. Therefore, in the example shown, the memory array 12 includes M rows, N columns, and M×N bit cells 210. The bit lines BL1, BLN, etc., can be selectively connected to the sense amplifier 100 via switches (not shown) depending on exactly which bit cell in the array is to be read to or written from.

Because the bit cells 210 are the same in construction and operation, only one, i.e., the bit cell 210a, will be described here. In this embodiment, the bit cell 210a includes a transistor 230 and a resistive element 240. The transistor 230 can be a field-effect transistor (FET), e.g., a metal-oxide semiconductor FET (MOSFET), and includes a first source/drain terminal 230a connected to the source line SL1, a second source/drain terminal 230b, and a gate terminal 230c connected to the word line WL1. In an alternative embodiment, the memory device 10 does not include the source line SL. In such an alternative embodiment, the first source/drain terminal 230a of the transistor 230 is connected to a ground or other node of the memory device 10. The transistor 230 may be any type of transistor, including, e.g., a junction-type transistor, such as a bipolar junction transistor (BJT).

The resistive element 240 is connected between the second source/drain terminal 230b of the transistor 230 and the bit line BL1. In some embodiments, the resistive element 240 is an MTJ. The resistive element 240 may be any type of resistive element or circuit so long as it achieves the intended function described herein.

In an exemplary write operation, write voltages are applied to the bit line BL1, the source line SL1, and the word line WL1. A voltage applied to the word line WL1 activates the transistor 230 and a write current flows through the bit cell 210a. That write current flows through the MTJ 240, causing the MTJ 240 to switch from a parallel state to an anti-parallel state or vice versa, whereby a bit of data is written and stored in the bit cell 210a. When it is desired to switch the MTJ 240 from the anti-parallel state to the parallel state to store a "0" value, a switch current is passed through the MTJ 240 from the free layer to the reference layer. Conversely, when it is desired to switch the MTJ 240 from the parallel state to the anti-parallel state to store a "1" value, a switch current is passed through the MTJ 240 from the reference layer to the free layer.

When the free layer of the MTJ 240 is in the parallel state, the MTJ 240 exhibits a low resistance that represents a logic "0" value and the MTJ 240 is said to be in a parallel state or a low resistance state. Conversely, when the free layer is in the anti-parallel state, the MTJ 240 exhibits a high resistance that represents a logic "1" value and the MTJ 240 is said to be in an anti-parallel state or a high resistance state. In some embodiments, the logic represented by the MTJ 240 in a high or low resistance state is arbitrary, e.g. the logic "1" can be represented by the MTJ 240 in a low resistance state and the logic "0" can be represented by the MTJ 240 in a high resistance, and is determined by the desired convention used for the memory device. Whichever convention is chosen, the MTJ 240 can store binary data via two writeable and readable states, e.g. the high resistance and low resistance states. For purposes of consistency, embodiments described herein will use the convention that the MTJ 240 in the low resistance state represents a "0" and the MTJ 240 in the high resistance state represents a "1," unless otherwise stated.

In an exemplary read operation, read voltages are applied to the bit line BL and the source line SL associated with a column of a selected bit cell 210 to be read, as well as the word line WL associated with a word of a selected bit to be read. For example, read voltages can be applied to the bit line BL1, the source line SL1, and the word line WL1 to read the bit stored in the bit cell 210a. To select other cells, different combinations of bit lines, source lines, and word lines are activated to produce a read current indicative of the data stored at the respective cell.

In the example shown, when the bit cell 210a is read, a read current Iread flows through the resistive element 240, e.g. MTJ 240. The magnitude of the read current Iread corresponds to a resistance state of the MTJ 240. For example, when the MTJ 240 is in a low resistance state, i.e., a parallel state, the read current Iread will be greater than the reference current Iref from the reference cell in the reference circuit 14 shown in FIG. 1. This indicates that the bit cell 210a stores a bit logic "0" value of data therein. Conversely, when the MTJ 240 is in a high resistance state, i.e., an anti-parallel state, the read current Iread will be less than the reference current Iref, indicating that the bit cell 210a stores a bit logic "1" value of data therein. The sense amplifier 100 can compare the read current Iread to the reference current Iref to sense a bit logic "0" or "1" value of data stored in the bit cell 210a. The sense amplifier 100 amplifies a level of the sensed bit of data and outputs the amplified bit of data such that the bit of data stored in the bit cell 210a can be read therefrom.

In order for the sense amplifier 100 to accurately sense the bit of data stored in the bit cells 210, the amount of the reference current Iref should be between the amount of a read current Iread when the MTJ 240 is in the parallel state and the amount of a read current Iread when the MTJ 240 is in the anti-parallel state. It should be understood that an MTJ is susceptible to temperature and process variations. As such, in order for the reference circuit 14 to generate such a reference current Iref, in some embodiments, the reference circuit 14 includes a resistive element that is of the same type as the resistive element 240 of the bit cells 210, for example, at least some of the resistive elements of the reference circuit 14 are MTJs of the same type as the MTJs 240 of the bit cells 210. This allows the reference circuit 14 to track temperature and process variations of the resistive elements 240 of the bit cells 210. A voltage or current source that generates constant reference voltages or currents is not capable of tracking temperature and process variations of an MTJ.

In some embodiments, prior to operation of the reference circuit 14 such as to generate the reference current Iref for comparison to the read current Iread in a read operation, the MTJ resistive elements of the reference circuit 14 are first switched to an anti-parallel state. The anti-parallel, e.g. high resistance, state produces a reference current that is of a lesser magnitude than implementations that route the reference current through MTJ resistive elements in the parallel state. By routing the reference current through a combination of one or more MTJs in an anti-parallel state, a reference current Iref can be generated having a magnitude between the magnitude of the read current Iread when the bit cell contains a "0" data value and the magnitude of the read current Iread when the bit cell contains a "1" data value.

Due to process, voltage, and temperature (PVT) variations, individual MRAM cells of the array and/or reference circuit may have different RH values (when programmed at RH) and different RL values (when programmed at RL). Moreover, a mismatch or offset between components often exists in a sense amplifier circuit due to such PVT variations. In some instances, such variation is addressed by trimming, or adjusting a sense amplifier based on empirically developed trimming information input to the sense amplifier 100.

Referring back to FIG. 1, the illustrated device 10 thus includes one or more trimming registers 110 that store trimming information for input to the sense amplifier 100 to adjust or trim the sense amplifier 100. The trimming information is retrieved after power-on of the device 10 and input to the trimming register 110. However, the trimming information is retrieved before user read operations for reading the user data from the memory array. In some known implementations, the trimming information is stored in a separate nonvolatile memory, such as an embedded eFUSE array and read therefrom with a separate sense amplifier(s). Such additional memory arrays and associated sense amplifier(s) can import a substantial area penalty for the device. As noted above, trimming information for the sense amplifier is retrieved after power-on, but before user read operations since such read operations require the trimming information be applied to the sense amplifier. With conventional memory devices, reading the trimming information from the memory array before the sense amplifier is properly trimmed can result in inaccurate trimming information being retrieved for subsequent application the sense amplifier.

In accordance with some examples, trimming information 16 is stored in a portion of the memory array 12, while other portions of the array 12 store user data 18, for example. This eliminates the need for a separate nonvolatile memory and associated sense amplifier for storing trimming information, thus reducing space requirements. As discussed in further detail below, trimming information 16 is stored in the memory array 12 and read therefrom using techniques such as two-cell-per-bit, error correction code (ECC) schemes, majority voting, read bias integrity checking, etc. to make the recall of the sense amplifier trimming information 16 more robust under PVT variations that may be associated with the memory array 12. Thus, trimming information 16 may be read out from the memory array 12 using the sense amplifier 100, resulting in a more compact device since an additional nonvolatile memory for storing trimming information is unnecessary.

In the illustrated example, the sense amplifier 100 includes a sense amplifier default operation control terminal 102, and a trimming settings input terminal 104. For example, embodiments of the memory device 10 are configured to load trim settings into the sense amplifier 100 upon power up of the device 10. Thus, upon start-up of the memory device 10, the sense amplifier 100 is configured to read the trim information 16 from the memory array 12.

Since the trimming information 16 is stored in the memory array 12, such trimming information 16 is not yet available to the sense amplifier at start-up of the memory device 10. Thus, the sense amplifier 100 may be set to a state in which trimming register settings are bypassed in response to a SA_DEFAULT signal received on the default operation control terminal 102. In other words, when the trimming information 16 is read out from the memory array 12, the trim information 16 is not applied to the sense amplifier 100—the sense amplifier 100 is operating in an "untrimmed" mode. This is in contrast to the default or "trimmed" mode used for reading user data 18 by the trimmed sense amplifier 100 (i.e. trim settings are applied to the sense amplifier 100). As will be discussed further below, disclosed embodiments employ various techniques to make the recall of the sense amplifier trimming information 16 from the memory array 12 by the untrimmed sense amplifier 100 more robust under PVT variations.

The trimming information 16 read from the memory array 12 may be stored in trimming registers 110. More specifically, in some embodiments a LOAD control signal is input to a load control terminal 112 to store the read-out trimming information data 16 in the trimming registers 120, and a trimming register select control terminal 114 receives a TRIM_SEL signal to indicate which trimming register 110 is to be written to. Once the trimming information 16 has been recalled from the memory array 12 and stored in the trimming registers 110, the SA_DEFAULT signal goes low such that the sense amplifier 100 operates in the trimmed mode, applying the trimming settings received on the trimming settings input terminal 104 from the trimming registers 110. The trimmed mode is used when the sense amplifier 100 is operated to read user data 18 from the memory array 12.

Figure 3:
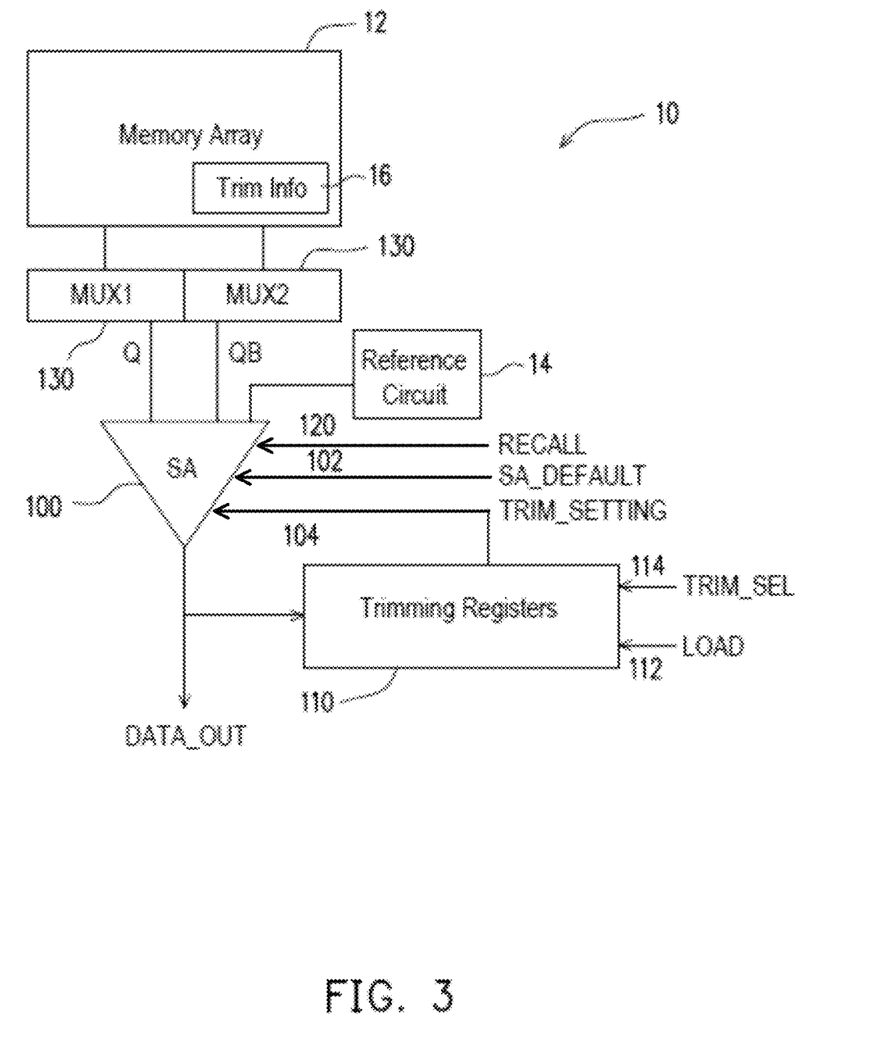
FIG. 3 is a block diagram illustrating another example of a memory device in accordance with some embodiments.

In some embodiments, the sense amplifier 100 is configured to operate in a "two-cell-per-bit" mode during recall of the trimming information 16 from the memory array 12. FIG. 3 illustrates such an embodiment of the memory device 10. Referring to FIG. 3, the illustrated sense amplifier 100 includes a recall mode control terminal 120 that receives a recall mode signal RECALL. By asserting the RECALL signal (e.g. RECALL=1), the sense amplifier 100 is configured for the two-cell-per-bit mode wherein each bit of the trimming information 16 has been written to two bit cells. As will be described further below, in the two-cell-per-bit mode, each bit of the trimming information 16 is stored as complementary data in the array 12 using two cells in opposite states. For example, {Q=1, QB=0} may represent one bit of trimming data having logic value "1", while {Q=0, QB=1} may represent one bit of trimming data having logic value "0".

In normal operation for reading user data 18 from the memory array 12, the sense amplifier 100 is configured to operate in a "one-cell-per-bit" mode by asserting, for example, RECALL=0. In the one-cell-per-bit mode operation, each bit of user data 18 is written to one corresponding bit cell as described above in conjunction with FIG. 2 for subsequent one-cell-per-bit mode read operations. More particularly, for one-cell-per-bit mode read operation, the sense amplifier 100 receives reference data from the reference circuit 14 and compares the read current Iread for a particular bit cell to the reference current Iref from a reference cell of the reference circuit 14 to sense a bit logic "0" or "1" value of data stored in a bit cell, such as bit cell 210a shown in FIG. 2.

In contrast, in the two-cell-per-bit mode for retrieving trimming information 16 from the array 12, the trimming information is written to the array 12 using the two-cellper-bit mode. For instance, a "1" trimming data bit may be written as a "1" data value to the bit cell 210a and a complementary "0" data value to the bit cell 210b. When the trimming information is read out from the array 12, the sense amplifier 100 compares the read current Iread for the bit cell 210a to the read current Iread for the bit cell 210b. Thus, the two-cell-per-bit mode offers a larger read margin as compared to one-cell-per-bit mode where the read current Iread is compared to the reference current Iref. This provides a more robust trimming information recall function prior to applying the trimming information to the sense amplifier 100.

Referring back to FIG. 3, when the trimming information 16 is to be read from the array 12, the sense amplifier 100 is set to the default mode by asserting the SA_DEFAULT signal (i.e. SA_DEFAULT=1) so that the trimming information 16 is read by the sense amplifier 100 without the trimming information 16 applied thereto. Further, the RECALL signal is asserted (i.e. RECALL=1) to operate the sense amplifier 100 in the two-cell-per-bit mode for retrieving the trimming information 16. Column multiplexers (MUX) 130 are operated in response to decoded memory addresses for the trimming information 16 to read Q and complement QB data from two respective bit cells for each bit of trimming information data. The read out trimming information 16 is stored into the appropriate trimming registers 110 in response to the LOAD and TRIM_SEL signals. When the trimming information 16 has been read out of the array 12 and stored into the trimming registers 110, the SA_DEFAULT and RECALL signals go low to set the sense amplifier 100 for normal operation to read user data 18 from the memory array 12. In this mode, the sense amplifier 100 operates in the trimmed mode (i.e. applying the trim settings) and in the one-cell-per-bit mode. The various logic (i.e. 1/0) signals described for the LOAD, TRIM_SEL, SA_DEFAULT, RECALL, etc. signals discussed are exemplary only. Other logic level setting for such signals are within the scope of the disclosure.

Figure 4:
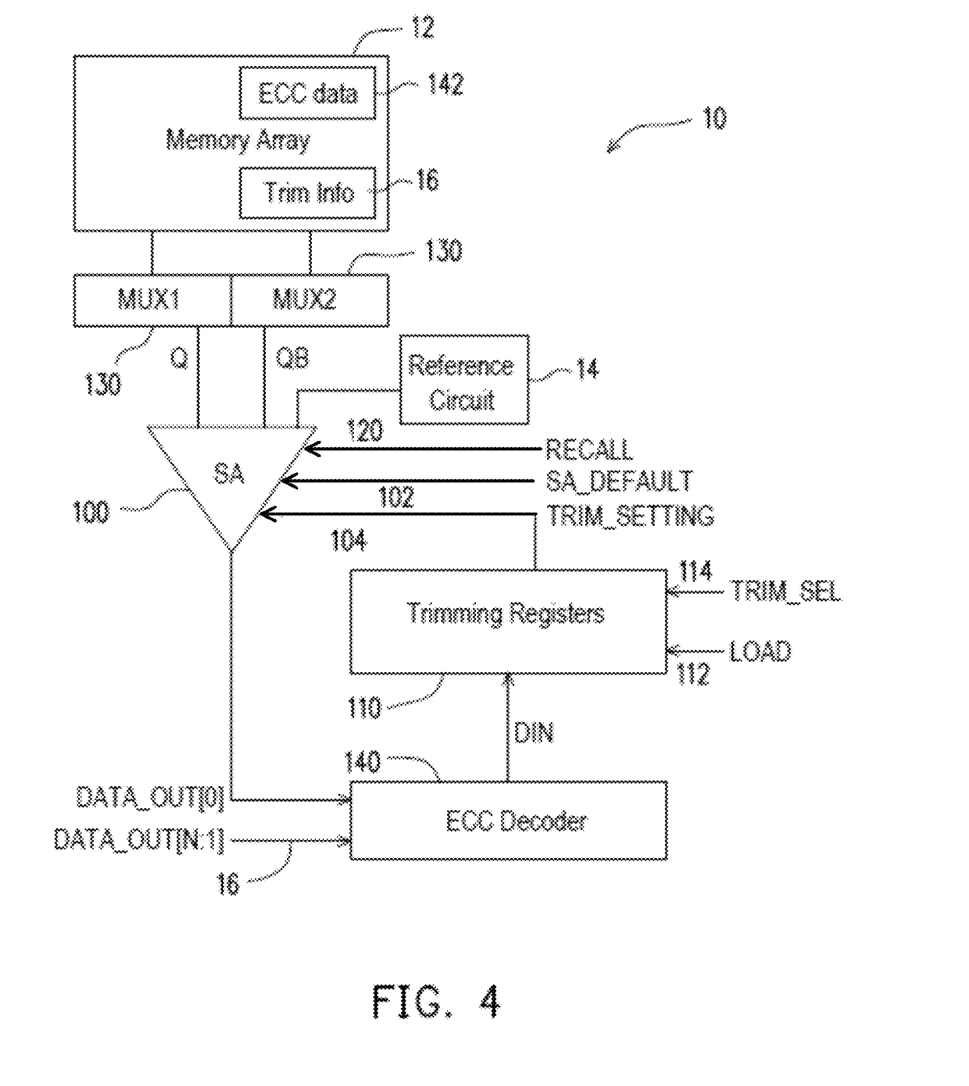
FIG. 4 is a block diagram illustrating a further example of a memory device in accordance with some embodiments.

FIG. 4 illustrates a further embodiment in which the reliability of retrieving the trimming information 16 from the memory array 12 using the untrimmed sense amplifier 100 is further improved by employing error correction code (ECC) schemes. ECC can be used to detect and correct bit errors for the trimming information 16 stored in the memory array 12. For instance, in some implementations ECC encodes trimming information 16 by generating ECC check bits, e.g., redundancy bits or parity bits, which are stored along with the trimming information 16 in the memory array 12. Data (i.e. trimming information 16) and parity bits together form a codeword. For example, an ECC that generates 8 parity bits for 64 bits of trimming data can usually detect two bit errors and correct one bit error in the 64 bits of data, known as a SECDED Hamming code, single-error correcting (SEC) and double-error detecting (DED). Other suitable ECC schemes include Bose-Chaudhuri-Hocquenghem (BCH) codes, which are constructed using polynomials over a finite field.

Data such as check bits used with the ECC scheme may be stored in the memory array 12. In some embodiments, ECC data 142 is also stored in the array 12 using the two-cell-per-bit scheme. For example, ECC data 142 included in one row of the memory array 12 may be referred to as a word. A codeword refers to a data string including the word plus parity bits added on in additional column(s) of the memory array. If a codeword includes a word portion with K bits and M parity bits, the codeword length N would be N=K+M. Thus, each of the K bits storing trimming information 16, as wells as the M parity bits may be written as complementary data in two bit cells i.e., two-cells-per-bit. Using the two-cell-per-bit scheme to store the trimming data 16 and ECC information improves the read margin for retrieving the trimming data by the untrimmed sense amplifier 100.

In the example shown in FIG. 4, the device 10 is configured to use ECC protection for the sense amplifier trimming information 16 stored in the array 12. When the trimming information 16 is to be read from the array 12, the sense amplifier 100 is set to the default mode by asserting the SA_DEFAULT signal (i.e. SA_DEFAULT=1) so that the trimming information 16 is read by the sense amplifier 100 without the trimming information 16 applied thereto (i.e. the sense amplifier 100 is in the untrimmed mode). Further, the RECALL signal is asserted (i.e. RECALL=1) to operate the sense amplifier 100 in the two-cell-per-bit mode.

The column MUXs 130 are operated in response to decoded memory addresses for the ECC data 142 stored in the array 12, and the data are read by the sense amplifier 100 and output to an ECC decoder 140. Additionally, trimming data 16 read by other sense amplifiers 100 of the device 12 is input to the ECC decoder 140. Thus, during trimming recall, the read-out trim information 16 from multiple IOs are first fed to the ECC decoder 140. After decoding out the proper settings, the decoded data DIN is fed back to the sense amplifier(s) 100 and stored in the trimming registers 110. The SA_DEFAULT and RECALL signals then go low to set the sense amplifier 100 to operate in the trimmed mode (i.e. applying the trim settings) in and in the one-cell-per-bit mode for reading user data 18 from the array 12. The various logic (i.e. 1/0) signals described for the SA_DEFAULT, RECALL, etc. signals discussed are exemplary only. Other logic level setting for such signals are within the scope of the disclosure.

Figure 5:
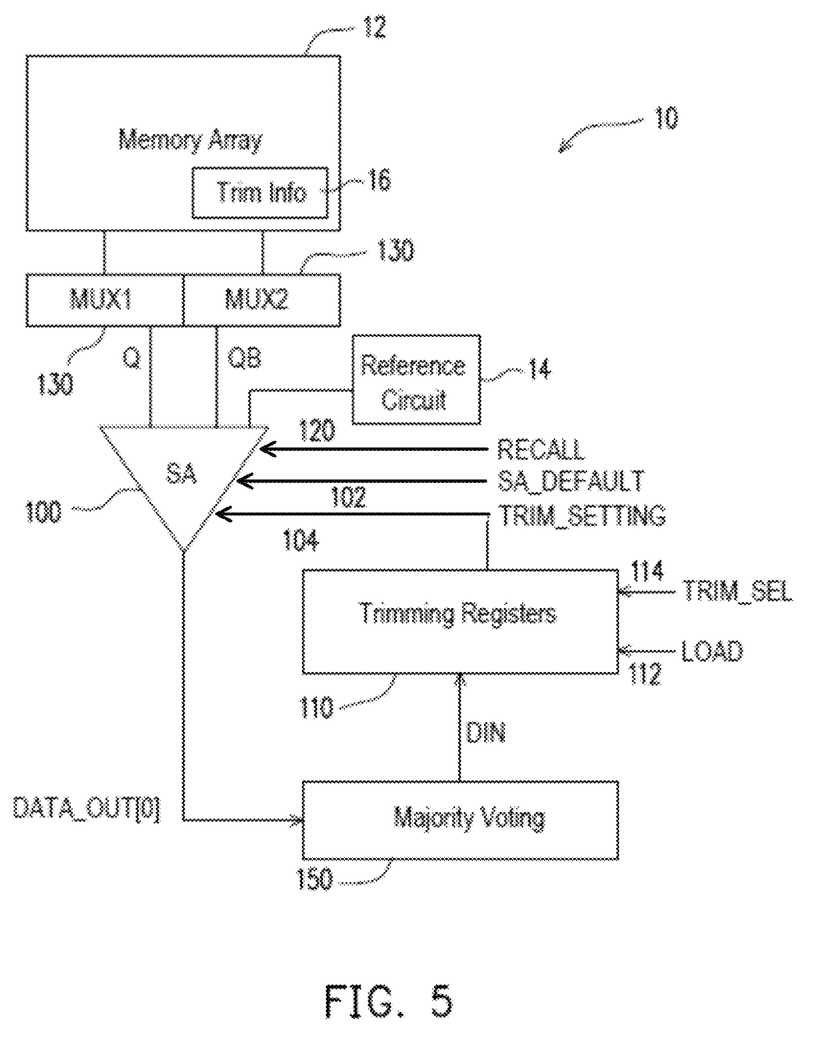
FIG. 5 is a block diagram illustrating yet another example of a memory device in accordance with some embodiments.

As noted above, the ECC schemes may be employed to improve the reliability of reading the trimming information by the untrimmed sense amplifier 100. Therefore, some embodiments employ a one-cell-per-bit scheme for storing the trimming information 16 in the array 12. In such embodiments, the input terminals 102 and 120 and corresponding RECALL and SA_DEFAULT signals may be omitted since it would be unnecessary to configure the sense amplifier 100 in the two-cell-per-bit mode. FIG. 5 illustrates an example where "majority voting" is employed for retrieving trimming information 16 by the untrimmed sense amplifier 100. In majority voting, each bit of the trimming information 16 is stored in the memory array 12 with multiple copies of the same content. In other words, to store a trimming data bit having logic value "1", multiple "1" data values are written to the array, and to store a trimming data bit having logic value "0", multiple "0" data values are written to the array. For example, for a "1" trimming data bit, a "1" would be written as three is (1,1,1) to three respective bit cells of the array 12 in a 3-copy majority vote scheme. During recall of the trimming information 16, the sense amplifier 100 reads out each copy of each bit of trimming data, and determines the data bit to be written to the trimming register 110 based on whether there are more 0s or more is for a given data bit. Thus, if there are more 0s read, a logic 0 data bit is written to the trimming register, and if there are more is read a logic 1 data bit is written to the trimming register.

For example, in a 3-copy majority vote scheme, if data for one bit of trim information 16 read from the array 12 by the sense amplifier 100 is 1,1,1, the final trim data written to the trimming register 110 is 1. If data read out is 1,1,0, the final trim data written to the trimming register 110 is 1, and if data read out is 1,0,0, the final trim data written to the trimming register 110 is 0. If data read out is 0,0,0, the final trim data written to the trimming register 110 is also 0. Such majority voting schemes may provide better immunity to occasional read fails due to marginal read bits. In other words, while some bits of trim data may be read incorrectly due to PVT variations it is less likely that the majority of the trim data bits would be incorrectly read.

In the example shown in FIG. 5, the two-cell-per-bit scheme may be used when writing and reading the trim data 16 to and from the array 12. Thus, a "1" trimming data bit, Q is written as 1,1,1, while QB is written as 0,0,0. Accordingly, six bit cells are used to store one bit of trim information.

When the trimming information 16 is to be read from the array 12, the sense amplifier 100 is set to the default mode by asserting the SA_DEFAULT signal (i.e. SA_DEFAULT=1) so that the trimming information 16 is read by the sense amplifier 100 without the trimming information 16 applied thereto (i.e. the sense amplifier 100 is in the untrimmed mode). Further, the RECALL signal is asserted (i.e. RECALL=1) to operate the sense amplifier 100 in the two-cell-per-bit mode. The column MUXs 130 are operated in response to decoded memory addresses for the trimming data 16 stored in the array 12, and the data are read by the sense amplifier 100 and output to a majority voting decoder 150, which evaluates the multiple Q, QB values read out for each copy of each bit of trimming information 16. As described above, the multiple copies of each trimming information data bit are counted, and the majority value (i.e. value with the most 1s or 0s) is output to the trimming register 110 as decoded data DIN. The SA_DEFAULT and RECALL signals then go low to set the sense amplifier 100 to operate in the trimmed mode (i.e. applying the trim settings) in and in the one-cell-per-bit mode for reading user data 18 from the array 12. The various logic (i.e. 1/0) signals described for the SA_DEFAULT, RECALL, etc. signals discussed are exemplary only. Other logic level setting for such signals are within the scope of the disclosure In other embodiments, the majority voting arrangement is used in conjunction with a one-cell-per-bit read/write scheme, since majority voting itself improves reliability of the trim information recall process. In such embodiments, the input terminals 102 and 120 and corresponding SA_DEFAULT and RECALL signals may be omitted since it would be unnecessary to configure the sense amplifier 100 in the two-cell-per-bit mode.

Figure 6:
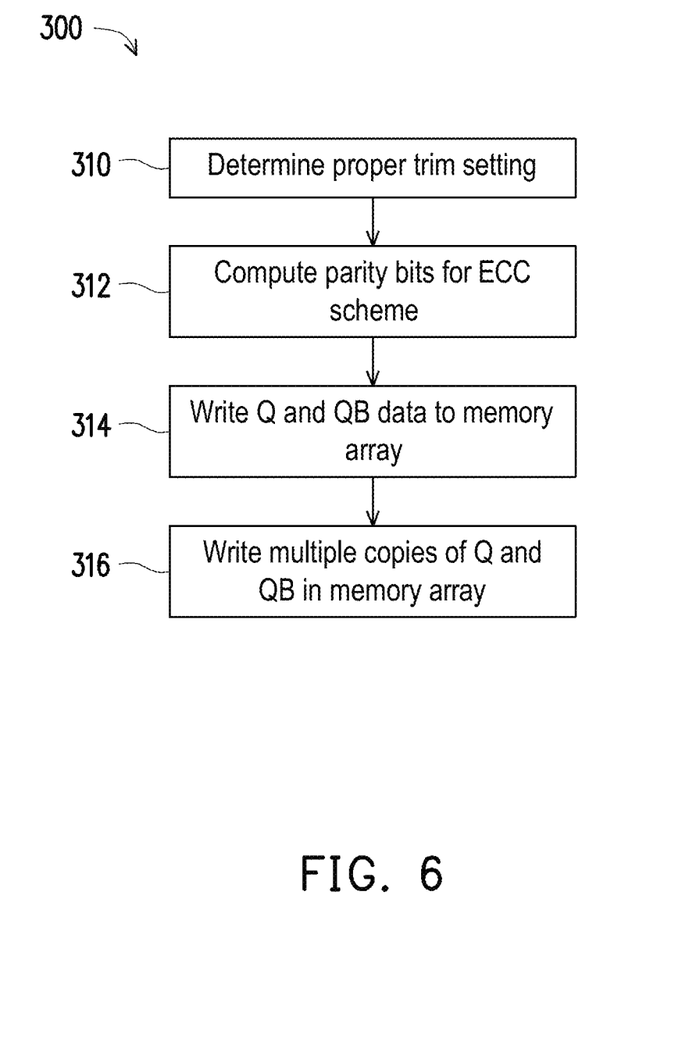
FIG. 6 is a flow diagram illustrating an example of a method in accordance with some embodiments.

FIG. 6 illustrates a method 300 for storing trimming information 16 in the memory array 12 in accordance with some embodiments. As noted above, a mismatch or offset between components in a sense amplifier circuit may exist due to PVT variations. In some instances, this variation may be addressed by trimming, or adjusting the sense amplifier 100 based on empirically developed trimming information input to the sense amplifier 100. Accordingly, at step 310, proper trim settings for the sense amplifier 100 are determined.

In some embodiments, such as the example shown in FIG. 4, ECC parity bits are computed in step 312. In step 314, the trimming information 16 and ECC parity bits, if applicable, are written to the memory array 12. In the illustrated example, the two-cell-per-bit mode is used, so Q and QB data are written to the array 12 in two respective bit cells for each bit of trim and ECC data. Further, in embodiments such as the majority vote example shown in FIG. 5, multiple copies of the Q and QB date are written to the array 12 for each bit of trimming information.

Figure 7:
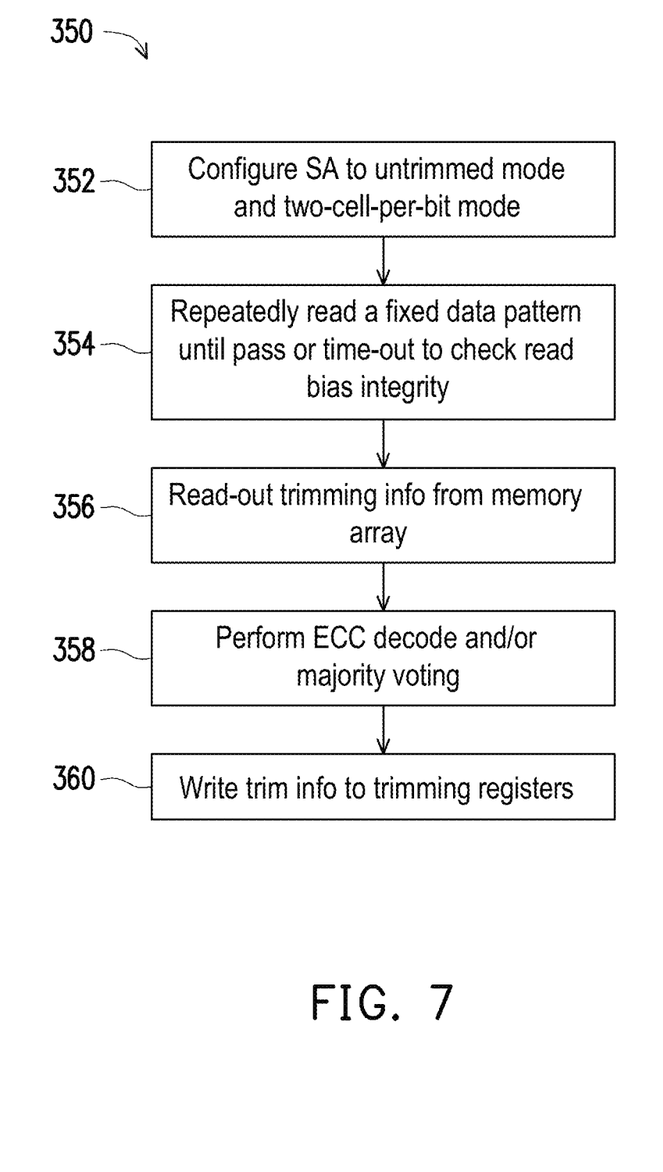
FIG. 7 is a flow diagram illustrating an example of another method in accordance with some embodiments.

FIG. 7 illustrates another method 350 in accordance with some embodiments, where trimming information is read from the array 12. In step 352, a sense amplifier 100 is configured for a particular mode of operation such as by receiving a configure signal. For instance, the sense amplifier 100 may be configured to an untrimmed mode (trimming information not applied to the sense amplifier). In embodiments where the two-cell-per-bit read/write scheme is employed, the sense amplifier is further configured to the two-cell-per-bit mode. In other embodiments where a one-cell-per-bit read/write operation is used, this step is unnecessary.

In some implementations, read reliability of the trimming information 16 is further enhanced by checking read bias integrity at step 354. This provides a way to improve the accuracy and reliability of the trimming information 16 read from the memory array 12. More particularly, in some cases a predetermined fixed data pattern (i.e. a predetermined pattern of 1s and 0s) is written to a given address of the memory array 12. Data from this address is read out and compared to the known data pattern. For instance, a pattern of eight is may be written to an address A. Subsequently, the data from address A is read out and compared to the known pattern (i.e. eight is). Criteria for a "satisfactory" read are predetermined. For instance, if seven of the eight bits read from address A are correct, the read-out data could be considered to satisfactorily match the predetermined pattern. More particularly, for a predetermined pattern of 11111111 (eight is) described above, read-out values of 11111111, 10111111, 11110111 would all be considered successful reads. On the other hand, read-out values of 00000000, 11001111, 11111001 would be considered unsuccessful reads (i.e. less than seven correct bits). In some examples, the data pattern is repeatedly read until the read-out data matches the known data pattern satisfactorily, or until the read bias integrity pass times out. Such read bias integrity tests may determine whether factors such as PVT variations are negatively impacting the read operation.

Once the read-out data matches the known data pattern satisfactorily, the trimming information 16 is then read from the array 12 in step 356. More specifically, as noted above, in embodiments employing the two-cell-per-bit scheme, the sense amplifier 100 compares a read current Iread of a first bit cell 210a to the read current Iread of a second bit cell 210b of the array 12 to determine the data value. This is in contrast to a one-cell-per-bit read mode, where the read current Iread of a bit cell is compared to a reference current Iref from a reference cell of a reference circuit to determine a data value.

In examples employing ECC and/or majority voting schemes, at step 358 the read-out trimming information 16 is decoded by the appropriate decoders such as the ECC decoder 140 shown in FIG. 4, and/or the majority voting decoder 150 shown in FIG. 5. At step 360, the trimming information 16 is written to the trimming registers 110 to be applied to the sense amplifier 100.

Thus, various disclosed examples provide a memory system, such as an MRAM, with a sense amplifier 100 that can operate in a trimmed mode for increased read robustness and yield. The trimming information 16 to be applied to the sense amplifier 100 is stored in the memory array 12 of the memory device 10 rather than in a separate memory array such as an eFUSE, and thus is retrieved after power-on and before user read operations. In other words, the sense amplifier 100 reads the trimming information 16 from the array 12 before the trimming information 16 is applied to the sense amplifier 100 (i.e. untrimmed mode).

Various techniques are applied to make the recall of the trimming information 16 more robust under PVT variations. Since the trimming information 16 is stored and read from the memory array 12 itself by the sense amplifier(s) 100 of the device, a more compact device may be provided.

In accordance with some disclosed embodiments, a memory device has a memory array with a plurality of bit cells, such as MRAM bit cells. The memory array is configured to store trimming information and also to store user data. A sense amplifier is configured to read the trimming information from the memory array, and a trimming register is configured to receive the trimming information from the sense amplifier. The sense amplifier is configured to receive the trimming information from the trimming register and thereby operate in a trimmed mode for reading the user data from the memory array.

In accordance with other embodiments, a method includes providing a memory array, such as an MRAM array. Trimming information for a sense amplifier is determined, and a first bit of the trimming information is written to a first bit cell the memory array and a complement of the first bit of the trimming information is written to a second bit cell the memory array.

In accordance with another embodiment, a method includes reading trimming information from a memory array by a sense amplifier, and storing the trimming information to a trimming register. The trimming information is applied to the sense amplifier, and thereafter user data is read from the memory array by the sense amplifier.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory array including a plurality of bit cells, the memory array configured to store trimming information and store user data;
   a sense amplifier configured to read the trimming information from the memory array;
   a trimming register configured to receive the trimming information from the sense amplifier; and
   wherein the sense amplifier is configured to receive the trimming information from the trimming register so as to operate in a trimmed mode for reading the user data from the memory array.

2. The memory device of claim 1, wherein the plurality of bit cells include MRAM bit cells.

3. The memory device of claim 1, wherein the sense amplifier is configured to read the trimming information from the memory array in an untrimmed mode in which the trimming information is not applied to the sense amplifier.

4. The memory device of claim 1, wherein the trimming information is stored in the memory array in a two-cell-per-bit mode.

5. The memory device of claim 1, wherein the user data is stored in the memory array in a one-cell-per-bit mode.

6. The memory device of claim 5, further comprising a reference circuit including a reference bit cell, wherein the sense amplifier is configured to compare a read current of a bit cell of the memory array with a reference current of the reference bit cell in the one-cell-per-bit mode.

7. The memory device of claim 1, further comprising an error correction code (ECC) decoder connected to an output of the sense amplifier, and wherein:
   the memory array is configured to store ECC data;
   the sense amplifier is configured to read the ECC data from the memory array in the untrimmed mode; and
   the ECC decoder is configured to receive the trimming information and the ECC data from the sense amplifier and output the trimming information to the trimming register.

8. The memory device of claim 1, further comprising a majority voting decoder connected to an output of the sense amplifier, and wherein:
   the memory array is configured to store multiple copies of each bit of the trimming information;
   the sense amplifier is configured to read each of the multiple copies of each bit of the trimming information in the untrimmed mode; and
   the majority voting decoder is configured receive the multiple copies of each bit of the trimming information and output the trimming information to the trimming register in response to the multiple copies of each bit of the trimming information.

9. The memory device of claim 1, wherein the sense amplifier is configured to repeatedly read a predetermined data pattern from the memory array before reading the trimming information from the memory array.

10. A method, comprising:
    providing a memory array;
    determining trimming information for a sense amplifier;
    writing a first bit of the trimming information to a first bit cell of the memory array; and
    writing a complement of the first bit of the trimming information to a second bit cell of the memory array.

11. The method of claim 10, wherein the memory array is an MRAM array.

12. The method of claim 10, further comprising writing user data to the memory array.

13. The method of claim 12, further comprising reading the trimming information from the memory array by the sense amplifier.

14. The method of claim 13, further comprising:
    applying the trimming information to the sense amplifier; and thereafter reading the user data from the memory array by the sense amplifier.

15. The method of claim 14, wherein the trimming information is read from the memory array by the sense amplifier before applying the trimming information.

16. The method of claim 13, wherein reading the trimming information includes comparing a read current of the first bit cell to a read current of the second bit cell.

17. The method of claim 10, further comprising writing multiple copies of the first bit of the trimming information to the memory array.

18. A method, comprising:
    reading trimming information from a memory array by a sense amplifier;
    storing the trimming information to a trimming register;
    applying the trimming information to the sense amplifier; and thereafter reading user data from the memory array by the sense amplifier.

19. The method of claim 18, further comprising reading ECC data from the memory array by the sense amplifier before applying the trimming information to the sense amplifier.

20. The method of claim 18, wherein the memory array includes a plurality of MRAM bit cells, and wherein reading the trimming information includes comparing a read current of a first bit cell of the plurality of bit cells to a read current of a second bit cell of the plurality of bit cells.

* * * * *